United States Patent
Bernhardt

(10) Patent No.: US 9,455,386 B2
(45) Date of Patent: Sep. 27, 2016

(54) VERTICAL LIGHT EMITTING DEVICES WITH NICKEL SILICIDE BONDING AND METHODS OF MANUFACTURING

(71) Applicant: Micron Technology, Inc., Boise, ID (US)

(72) Inventor: Michael J. Bernhardt, Meridian, ID (US)

(73) Assignee: Micron Technology, Inc., Boise, ID (US)

(\*) Notice: Subject to any disclaimer, the term of this patent is extended or adjusted under 35 U.S.C. 154(b) by 0 days.

(21) Appl. No.: 14/456,730

(22) Filed: Aug. 11, 2014

(65) Prior Publication Data

US 2014/0346553 A1    Nov. 27, 2014

Related U.S. Application Data

(62) Division of application No. 13/053,932, filed on Mar. 22, 2011, now Pat. No. 8,802,461.

(51) Int. Cl.
| | | |
|---|---|---|
| *H01L 33/62* | (2010.01) | |
| *H01L 33/40* | (2010.01) | |
| *H01L 33/20* | (2010.01) | |

(Continued)

(52) U.S. Cl.
CPC .......... *H01L 33/62* (2013.01); *H01L 33/0079* (2013.01); *H01L 33/20* (2013.01); *H01L 33/405* (2013.01); *H01L 33/42* (2013.01); *H01L 33/007* (2013.01); *H01L 33/0095* (2013.01)

(58) Field of Classification Search
CPC .............................. H01L 33/62; H01L 33/405
USPC ............ 257/98, 99, 184, E33.056, E33.057, 257/E33.06, E33.072
See application file for complete search history.

(56) References Cited

U.S. PATENT DOCUMENTS

| | | |
|---|---|---|
| 8,227,912 B2 | 7/2012 | Ohmi et al. |
| 2003/0039286 A1 | 2/2003 | Doi et al. |
| 2005/0087753 A1 | 4/2005 | D'Evelyn et al. |

(Continued)

FOREIGN PATENT DOCUMENTS

| | | |
|---|---|---|
| WO | 2010020077 A1 | 2/2010 |
| WO | 2010065860 A2 | 6/2010 |

OTHER PUBLICATIONS

Xiao, Z-X. et al., "Silicon/glass wafer-to-wafer bonding with Ti/Ni intermediate bonding," Sensors and Actuators A, vol. 71, pp. 123-126, Nov. 1998.

(Continued)

*Primary Examiner* — Michele Fan
(74) *Attorney, Agent, or Firm* — Perkins Coie LLP

(57) ABSTRACT

Various embodiments of light emitting devices, assemblies, and methods of manufacturing are described herein. In one embodiment, a method for manufacturing a lighting emitting device includes forming a light emitting structure, and depositing a barrier material, a mirror material, and a bonding material on the light emitting structure in series. The bonding material contains nickel (Ni). The method also includes placing the light emitting structure onto a silicon substrate with the bonding material in contact with the silicon substrate and annealing the light emitting structure and the silicon substrate. As a result, a nickel silicide (NiSi) material is formed at an interface between the silicon substrate and the bonding material to mechanically couple the light emitting structure to the silicon substrate.

20 Claims, 11 Drawing Sheets

(51) Int. Cl.
   *H01L 33/42* (2010.01)
   *H01L 33/00* (2010.01)

(56) References Cited

U.S. PATENT DOCUMENTS

| | | | |
|---|---|---|---|
| 2005/0184300 A1* | 8/2005 | Tazima | H01L 33/30 257/94 |
| 2008/0041517 A1 | 2/2008 | Moriceau et al. | |
| 2008/0261340 A1* | 10/2008 | Matsuo | H01L 33/22 438/29 |
| 2009/0129593 A1 | 5/2009 | Ishii | |
| 2009/0267097 A1 | 10/2009 | Tu et al. | |
| 2011/0101304 A1 | 5/2011 | Song | |
| 2011/0133243 A1 | 6/2011 | Song | |
| 2012/0012871 A1 | 1/2012 | Hsia et al. | |
| 2012/0241785 A1 | 9/2012 | Bernhardt | |

OTHER PUBLICATIONS

Deng, F. et al., "Salicidation process using NiSi and its device application," J. Appl. Phys., vol. 81, No. 12, pp. 8047-8051, Jun. 15, 1997.

* cited by examiner

VERTICAL LIGHT EMITTING DEVICES WITH NICKEL SILICIDE BONDING AND METHODS OF MANUFACTURING

CROSS-REFERENCE TO RELATED APPLICATION

This application is a divisional of U.S. application Ser. No. 13/053,932 filed Mar. 22, 2011, now U.S. Pat. No. 8,802,461, which is incorporated herein by reference.

TECHNICAL FIELD

The present disclosure is related generally to light emitting devices (e.g., light emitting diodes ("LEDs")) with a nickel silicide (NiSi) bonding interface and associated methods of manufacturing.

BACKGROUND

During the manufacturing of LEDs with vertical contacts, the LEDs are typically first formed on a growth substrate and subsequently bonded to a carrier via copper-copper (Cu—Cu) or nickel-tin (Ni—Sn) bonding. FIGS. 1A-1C illustrate a process for manufacturing an LED with Ni—Sn bonding in accordance with the prior art. As shown in FIG. 1A, the process initially includes forming N-type gallium nitride (GaN) 14, GaN/indium gallium nitride (InGaN) multiple quantum wells ("MQWs") 16, and P-type GaN 18 on a substrate material 12 with a buffer material 13. Subsequently, a first metal stack 19 is formed on the P-type GaN 18 via sputtering, electrolysis, and/or other suitable techniques. The first metal stack 19 includes a barrier material 20 (e.g., tungsten/titanium (W/Ti)), a copper (Cu) seed material 22, nickel (Ni) 24, and tin (Sn) 26.

As shown in FIG. 1B, a similar second metal stack 19' is formed on a carrier 32. The second metal stack 19' includes a barrier material 20', a copper (Cu) seed material 22', nickel (Ni) 24', and tin (Sn) 26'. The multiple materials of the first and second metal stacks 19 and 19' are selected based on a target stress level on the substrate material 12. As shown in FIG. 1C, the substrate material 12 with the first metal stack 19 is then stacked on the carrier 32 such that the first and second metal stacks 19 and 19' face each other. The first and second metal stacks 19 and 19' are then bonded to each other using an annealing process to form an assembly 10. The substrate material 12 (shown in phantom lines) is then removed from the assembly 10 before the assembly 10 is diced into individual LED dies.

The bonded substrate material 12 and the carrier 32 formed according to the process discussed above tend to bow and/or otherwise flex with temperature fluctuations. Such flexure can crack and/or otherwise damage the N-type GaN 14, the GaN/InGaN MQWs 16, and/or the P-type GaN 18. Also, it has been observed that various materials in the first and/or second metal stacks 19 and 19' tend to peel off from the assembly 10 during dicing. It is believed that delamination between two adjacent materials in the first and second metal stacks 19 and 19' contribute to such delamination. In addition, the foregoing assembling process is time consuming and costly because a large number of metals are deposited in series. Accordingly, several improvements to the bonding techniques used to efficiently manufacture LED dies may be desirable.

DETAILED DESCRIPTION

Various embodiments of light emitting devices, assemblies, and methods of manufacturing are described below. As used hereinafter, the term "light emitting device" generally refers to LEDs, laser diodes, and/or other suitable solid state sources of illumination other than electrical filaments, a plasma, or a gas. A person skilled in the relevant art will also understand that the technology may have additional embodiments, and that the technology may be practiced without several of the details of the embodiments described below with reference to FIGS. 2A-3F.

FIGS. 2A-2H illustrate a process for manufacturing a light emitting device 100 with Ni—Si bonding in accordance with selected embodiments of the technology. In the following description, common acts and structures are identified by the same reference numbers. Even though only particular processing operations and associated structures are illustrated in FIGS. 2A-2H, in certain embodiments, the process can also include forming a lens, a mirror, suitable support structures, conductive interconnects, and/or other mechanical/electrical components (not shown) associated with a packaged light emitting device.

Figure 2A:
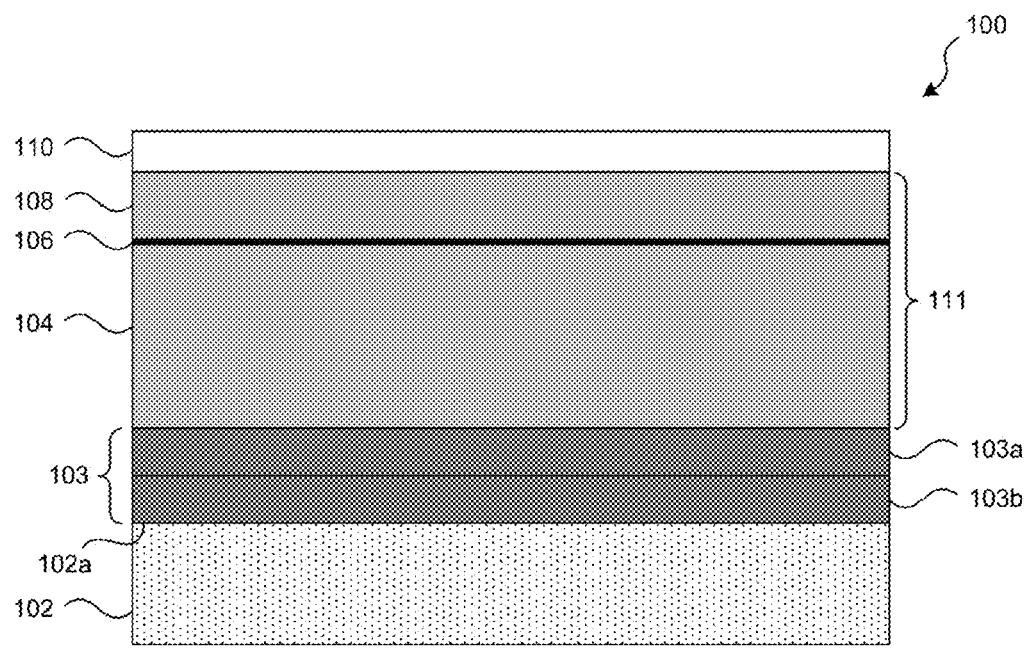
FIGS. 2A-2H illustrate a process for manufacturing an LED with Ni—Si bonding in accordance with selected embodiments of the technology.

As shown in FIG. 2A, an initial stage of the process can include forming a first semiconductor material 104, an active region 106, and a second semiconductor material 108 (collectively referred to as a "light emitting structure 111" hereinafter) on a substrate material 102. In one embodiment, the substrate material 102 includes a silicon (Si) wafer with a Si(1,1,1) crystal orientation at a surface 102a of the substrate material 102. In other embodiments, the substrate material 102 can also include aluminum gallium nitride (AlGaN), GaN, silicon carbide (SiC), sapphire ($Al_2O_3$), a combination of the foregoing materials, and/or other suitable substrate materials.

In the illustrated embodiment, the substrate material 102 optionally includes a first buffer material 103a and a second buffer material 103b (collectively referred to as buffer materials 103) on the surface 102a. The optional buffer materials 103 can individually include aluminum nitride (AlN), GaN, zinc nitride (ZnN), and/or other suitable materials. In other embodiments, the substrate material 102 may include only one of the buffer materials 103. In further embodiments, the buffer materials 103 may be omitted, and the light emitting structure 111 may be formed directly on the surface 102a of the substrate material 102. In yet further embodiments, other intermediate materials (e.g., zinc oxide ($ZnO_2$)) may be formed on the substrate material 102 in addition to or in lieu of the buffer materials 103.

In one embodiment, the first and second semiconductor materials 104 and 108 include an N-type GaN material and a P-type GaN material, respectively. In another embodiment, the first and second semiconductor materials 104 and 108 include a P-type GaN material and an N-type GaN material, respectively. In further embodiments, the first and second semiconductor materials 104 and 108 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, InGaN/GaN MQWs, and/or an InGaN bulk material. In other embodiments, the active region 106 can include aluminum gallium indium phosphide (AlGaInP), aluminum gallium indium nitride (AlGaInN), and/or other suitable materials or configurations. In any of the foregoing embodiments, the first semiconductor material 104, the active region 106, the second semiconductor material 108, and the buffer materials 103 can be formed on the substrate material 102 via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

An optional stage of the process can include forming a conductive material 110 on substantially the entire surface area of the second semiconductor material 108. The conductive material 110 is at least partially transparent to the radiation generated by the light emitting structure 111. In certain embodiments, the conductive material 110 can include indium tin oxide ("ITO"), aluminum zinc oxide ("AZO"), fluorine-doped tin oxide ("FTO"), and/or other suitable transparent conductive oxide ("TCOs"). In other embodiments, the conductive material 110 can include other suitable conductive and transparent materials. Techniques for forming the conductive material 110 can include MOCVD, MBE, spray pyrolysis, pulsed laser deposition, sputtering, electroplating, and/or other suitable deposition techniques. In further embodiments, the conductive material 110 may be omitted.

Figure 2B:
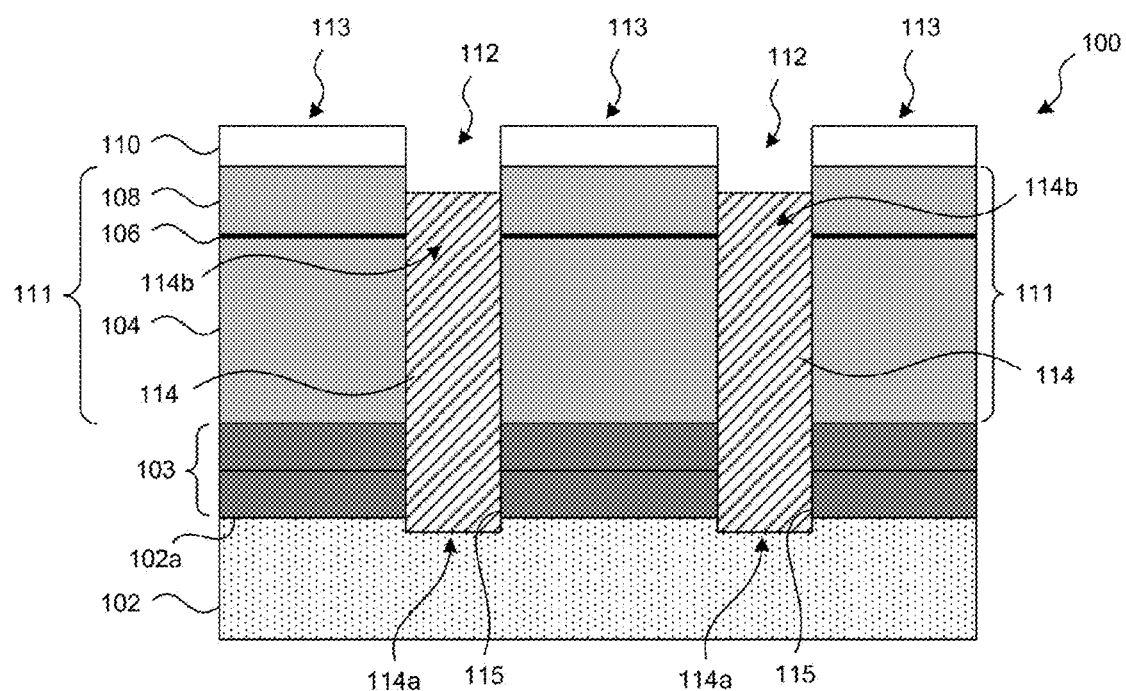

FIG. 2B illustrates another stage of the process, in which a plurality of openings 112 are formed in the optional conductive material 110 and the light emitting structure 111, and a passivation material 114 is formed or deposited in the openings 112. The openings 112 individually contain passivation material 114. Two openings 112 are shown in FIG. 2B for illustration purposes, though any other desired numbers of openings 112 may be formed. In certain embodiments, the individual openings 112 can delineate individual light emitting dies 113. In other embodiments, the openings 112 can insulate and/or form other suitable structures between adjacent sections of the light emitting structure 111 in addition to or in lieu of delineating the individual light emitting dies 113.

In the illustrated embodiment, the openings 112 include sidewalls 115 extending through the conductive material 110, the first semiconductor material 104, the active region 106, the second semiconductor material 108, the buffer materials 103, and into a portion of the substrate material 102. In other embodiments, at least some of the openings 112 include sidewalls 115 extending through the conductive material 110 into a portion of the buffer materials 103 without extending into the substrate material 102. In further embodiments, the openings 112 can include sidewalls 115 extending through the conductive material 110 into a portion of the first semiconductor material 104 without extending into the buffer material 103. In any of the foregoing embodiments, the openings 112 can include sidewalls 115 extending through at least the active region 106 of the light emitting structure 111.

The passivation material 114 can include at least one of silicon oxide ($SiO_2$), silicon nitride ($Si_3N_4$), and/or other suitable insulative materials. In the illustrated embodiment, the passivation material 114 only partially fills the openings 112. Thus, the passivation material 114 includes a first end 114a proximate the substrate material 102 and a second end 114b recessed from the conductive material 110. As such, the second end 114b is spaced apart from the conductive material 110 in this embodiment. In other embodiments, the passivation material 114 may completely fill the openings 112 such that the second end 114b is generally planar with the conductive material 110. In further embodiments, the passivation material 114 may be a thinner structure that generally conforms to the contour of the substrate material 102 and the sidewalls 115 of the openings 112 without filling the openings 112. In any of the foregoing embodiments, the passivation material 114 covers at least the active region 106 of the light emitting structure 111.

Figure 2C:
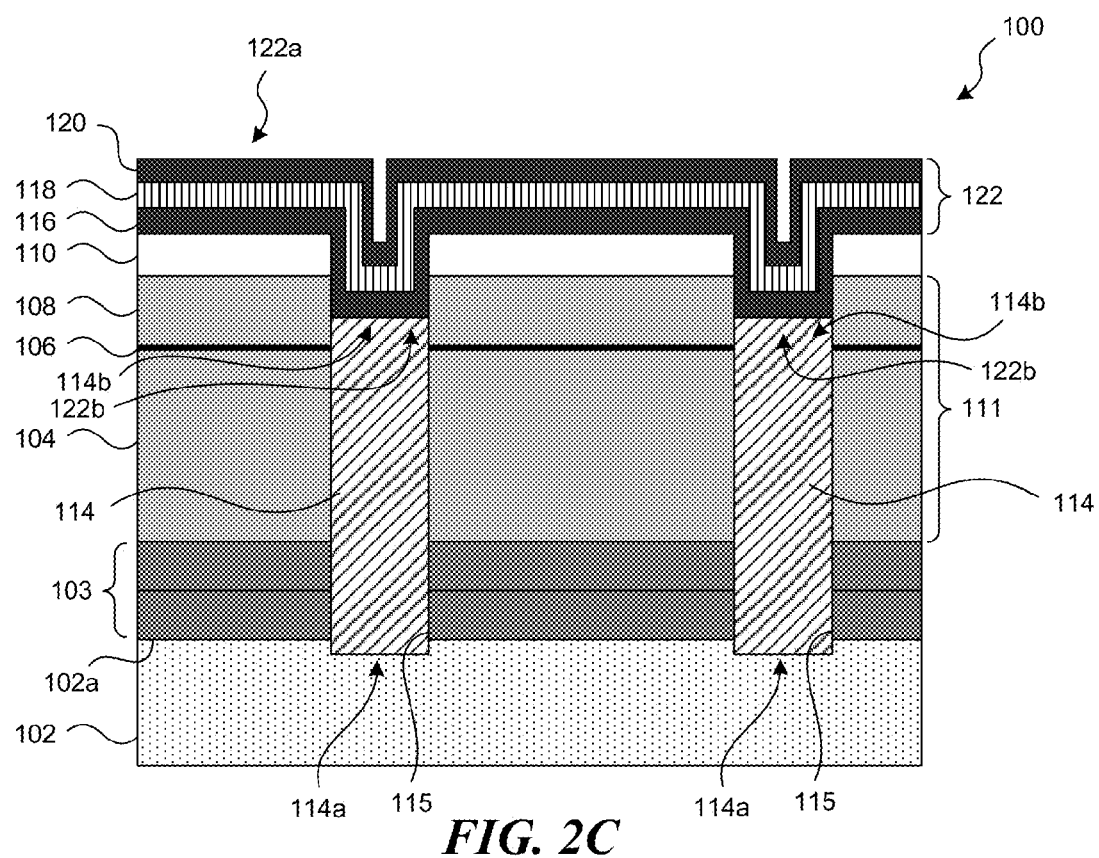

FIG. 2C illustrates another stage of the process in which a barrier material 116, a mirror material 118, and a bonding material 120 (collectively referred to as a bonding stack 122) are formed on the optional conductive material 110 in series. The barrier material 116 can include nickel (Ni), tantalum (Ta), cobalt (Co), ruthenium (Ru), tantalum nitride (TaN), indium oxide ($In_2O_3$), tungsten nitride ($WN_2$), titanium nitride (TiN), and/or other suitable diffusion resistant materials. The mirror material 118 can include silver (Ag), aluminum (Al), and/or other suitable reflective materials. The bonding material 120 can include nickel (Ni) and/or a nickel alloy with a thickness between about 100 Angstroms and about 300 Angstroms or other suitable thickness values. Techniques for forming the barrier material 116, the mirror material 118, and the bonding material 120 can include sputtering, electroplating, and/or other suitable deposition techniques.

In the illustrated embodiment, the bonding stack 122 include a first bonding portion 122a on the optional conductive material 110 and a second bonding portion 122b in the individual openings 112. The end of the second bonding portion 122b can abut the passivation material 114. In other embodiments, the first bonding portion 122a may be formed directly on the second semiconductor material 108 when the conductive material 110 is omitted. In further embodiments in which the passivation material 114 generally conforms to the sidewalls 115 of the openings 112, the second bonding portion 122b may extend into a cavity in the passivation material as deep as the first semiconductor material 104 and/or the buffer materials 103. In embodiments in which the passivation material 114 is planar to the surface of the light emitting structure 111, the second bonding material 112b can also be generally planar.

Figure 2D:
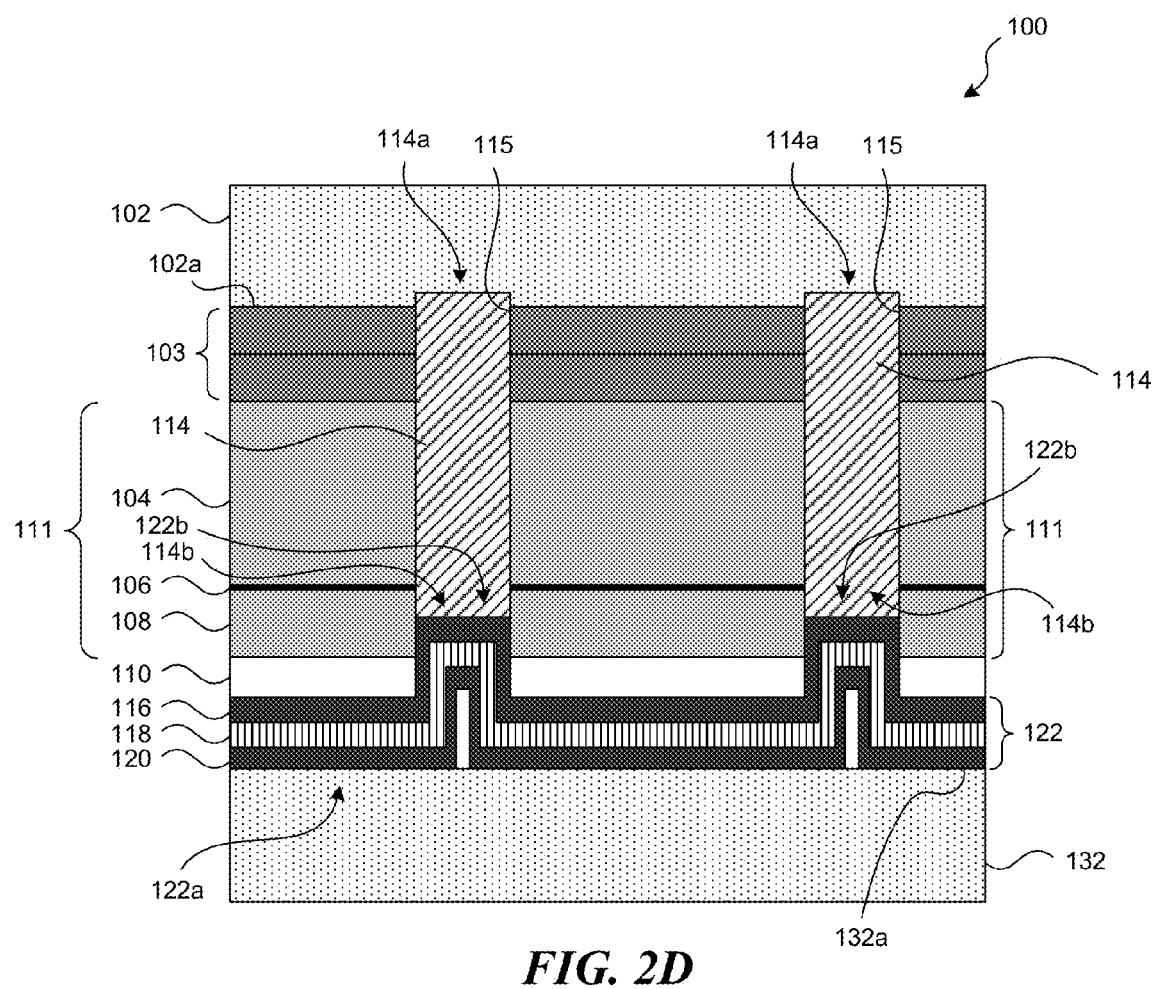

FIG. 2D illustrates another stage of the process, in which the light emitting structure 111 is mounted on a carrier 132 with the bonding stack 122 in direct contact with a surface 132a of the carrier 132. In one embodiment, the carrier 132 can include a silicon (Si) wafer with a Si(1,0,0) crystal orientation and with P-type doped (e.g., with boron (B)) polysilicon at the surface 132a of the carrier 132. In other embodiments, the silicon wafer may have other doping characteristics or may be undoped. In further embodiments, the carrier 132 may include a ceramic and/or other suitable types of carrier materials. Even though the carrier 132 is shown as a single material in FIG. 2D, in further embodiments, the carrier 132 may also include a heat sink, electrodes, and/or other suitable structures and components.

An optional stage of the process can include polishing and/or cleaning the surface 132a of the carrier 132 before to mounting the light emitting structure 111 thereon. In one embodiment, the carrier 132 may be polished using chemical mechanical polishing ("CMP"), electrochemical-mechanical polishing ("ECMP"), and/or other suitable polishing techniques. As a result, the surface 132a can be at least partially planarized. In other embodiments, the surface 132a of the carrier 132 may also be treated with a solution of hydrofluoric acid (HF), a base (e.g., potassium hydroxide (KOH)), an oxidizer (e.g., hydrogen peroxide ($H_2O_2$), and/or other suitable compositions. After the treatment, adsorbed particles may be removed from the surface 132a. Surface oxides, nitrides, and/or other compounds of silicon may also be removed. As a result, the carrier 132 includes exposed silicon atoms on the surface 132a that are in direct contact with the bonding material 120 of the bonding stack 122.

Figure 2E:
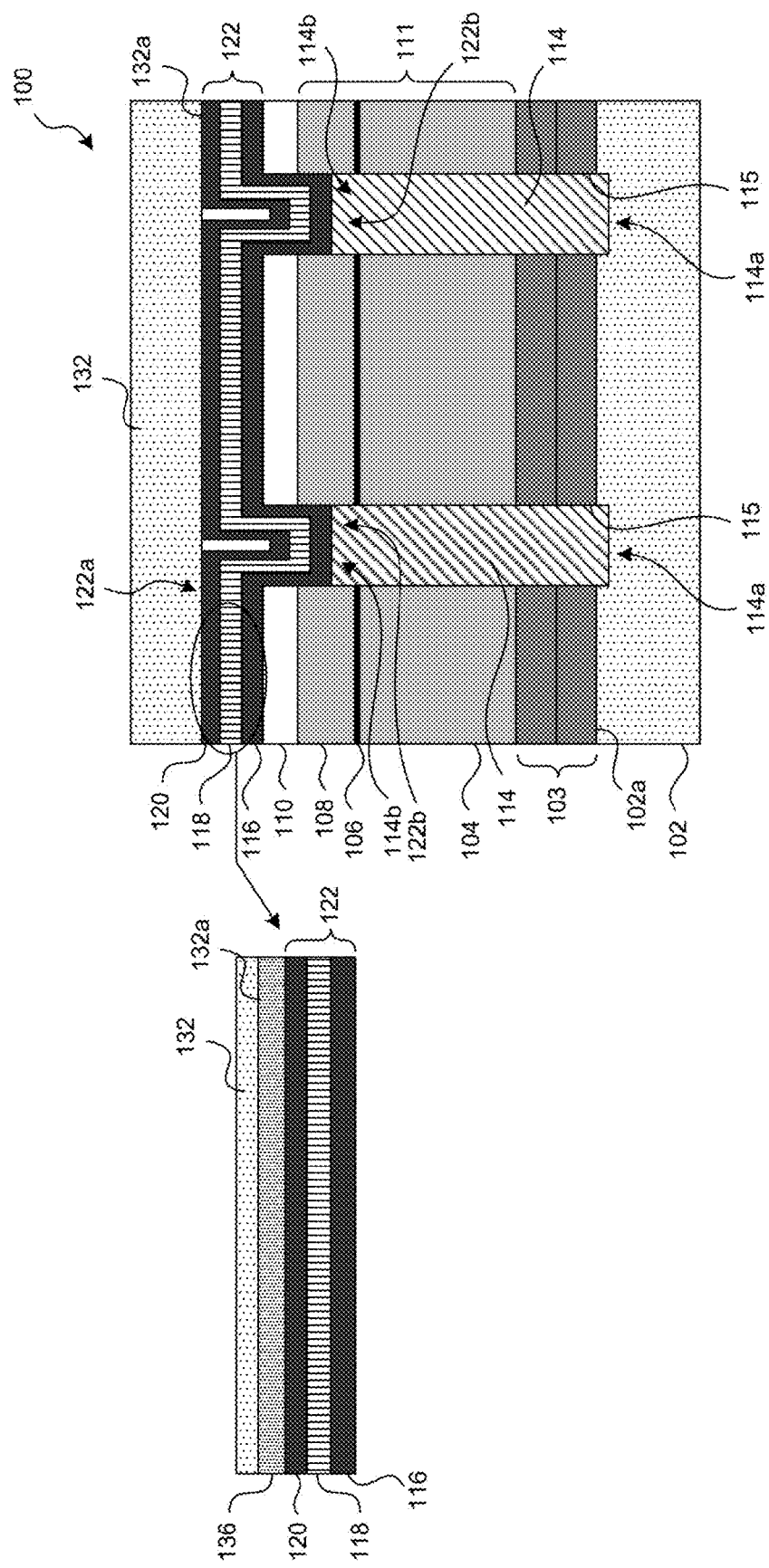

FIG. 2E illustrates a subsequent stage of the process in which the light emitting structure 111 and the carrier 132 are bonded together. In FIG. 2E, a portion of the interface between the bonding stack 122 and the carrier 132 is enlarged for clarity. In certain embodiments, bonding the light emitting structure 111 to the carrier 132 includes heating at least the bonding stack 122 and the carrier 132 to a bonding temperature via conduction, convection, radiation, a combination thereof or by other suitable means. The bonding temperature can be maintained for a period of time (referred to hereinafter as the "bonding period") under a bonding pressure. The bonding temperature can be from about 300° C. to about 450° C. (e.g., 300° C., 350° C., 400° C., or 450° C.), and/or other suitable values. The bonding period can last from about 1 to about 30 minutes and/or other suitable values. The bonding pressure can be from about 50 mPa to about 100 mPa (e.g., 50 mPa, 55 mPa, 60 mPa) and/or other suitable values.

Without being bound by theory, it is believed that the heating of the bonding stack 122 and the carrier 132 causes at least a portion of the bonding material 120 containing nickel (Ni) to react with the P-type polysilicon (and/or other silicon materials) on the surface 132a of the carrier 132. The reaction consumes a portion of the bonding material 120 and forms nickel silicide (NiSi) 136 at the interface between the carrier 132 and the bonding material 120 to mechanically bond the light emitting structure 111 and the carrier 132 together. The formed NiSi 136 may have a thickness between about 10 Angstroms and about 100 Angstroms.

In any of the foregoing embodiments, the process can include adjusting at least one of the bonding temperature, the bonding period, the bonding pressure, and/or other suitable operating conditions based on the desired thickness of the bonding material 120 remaining after the completion of the reaction. In one embodiment, the desired remaining thickness of the bonding material 120 is greater than about 30 Angstroms. In other embodiments, the desired remaining thickness of the bonding material 120 can be 40 Angstroms, 50 Angstroms, and/or other suitable thickness values.

In several embodiments, the remaining unconsumed portion of the bonding material 120 can form a diffusion barrier between the mirror material 118 and the carrier 132. As a result, the desired thickness of the remaining bonding material 120 can be determined based on empirical data and/or other suitable information so that the remaining bonding material 120 can prevent the mirror material 118 from migrating to the carrier 132. In further embodiments, the bonding material 120 may be completely consumed when the bonding stack 122 includes an additional diffusion barrier (not shown) between the mirror material 118 and the carrier 132.

Figure 2F:
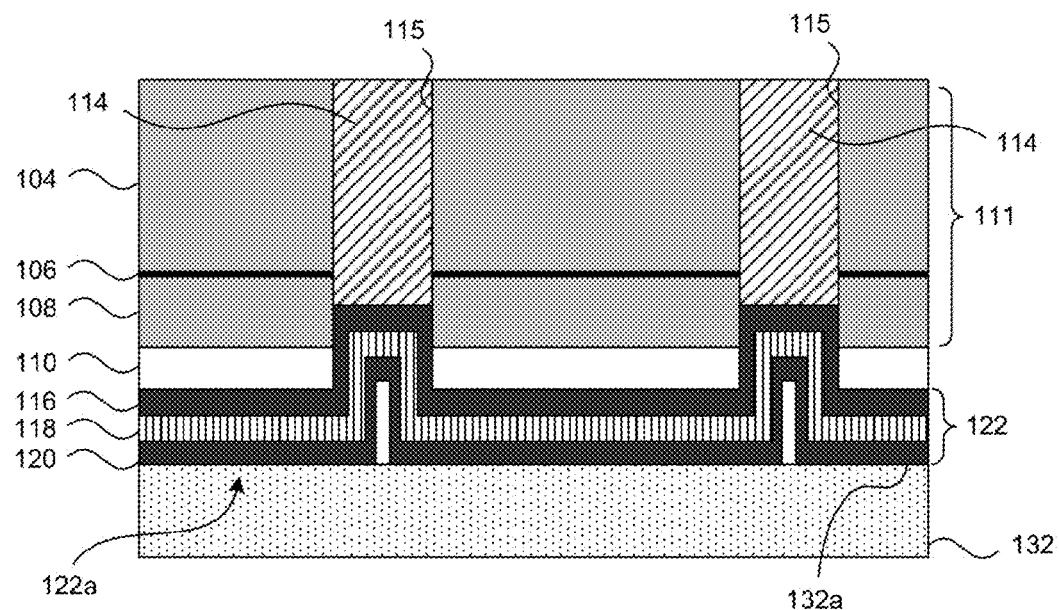

FIG. 2F illustrates another stage of the process, in which the substrate material 102 and the buffer materials 103 are removed from the light emitting structure 111. Techniques for removing the substrate material 102 and the buffer materials 103 can include back grinding, dry etching, wet etching, and/or other suitable material removal techniques. In the illustrated embodiment, the material removal operation is stopped at the first semiconductor material 104. In other embodiments, a portion of the first semiconductor material 104 may also be removed from the light emitting structure 111.

Figure 2G:
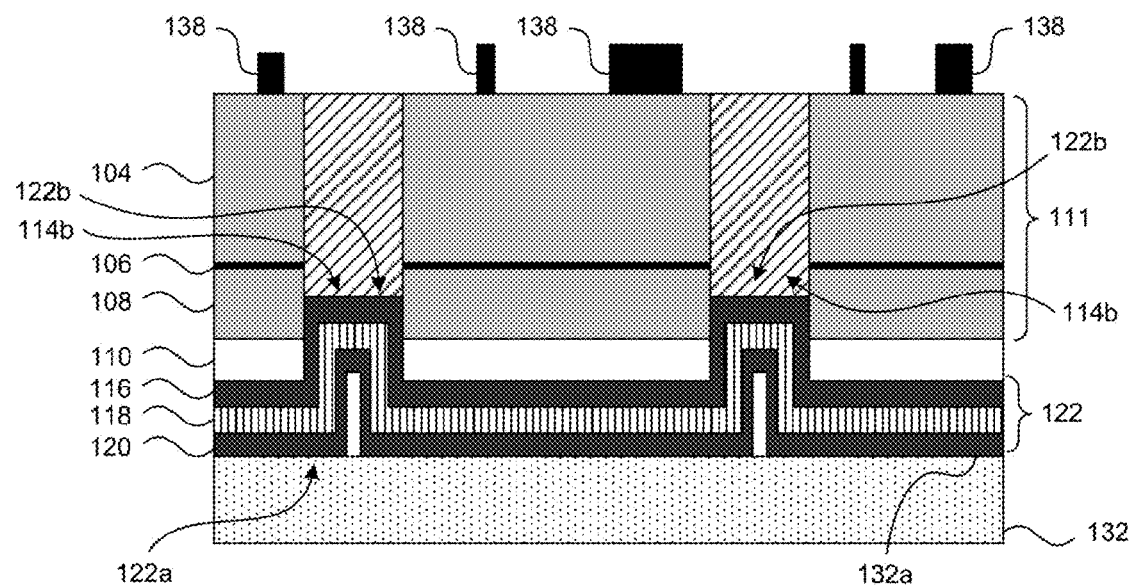

FIG. 2G illustrates another stage of the process, in which first electrodes 138 are formed on the first semiconductor material 104. In one embodiment, forming the first electrodes 138 can include depositing an electrical conductor (e.g., aluminum (Al), titanium (Ti), and/or an aluminum/titanium (Al/Ti) alloy) on the first semiconductor material 104 via sputtering and/or other suitable techniques. Subsequently, the deposited electrical conductor can be patterned based on a desired electrode pattern. During the deposition and/or patterning operations, the process can also include controlling the temperatures of these operations to be below the stability temperature of the NiSi 136. In one embodiment, the target stability temperature is about 550° C. In other embodiments, the target stability temperature can be about 600° C., 650° C., 700° C., and/or other suitable temperature values.

Figure 2H:
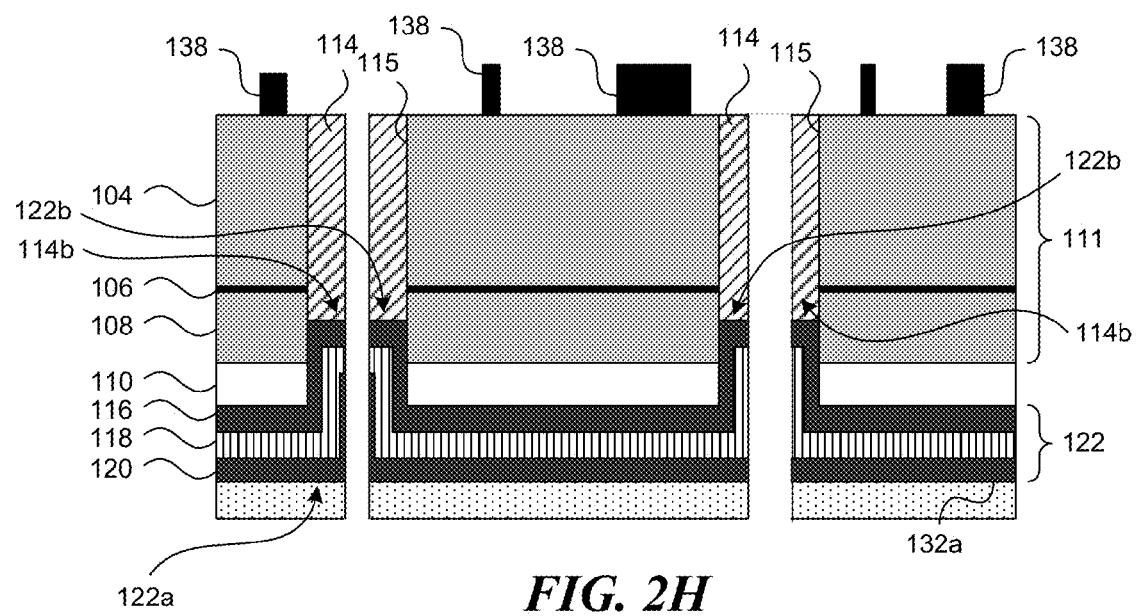

FIG. 2H illustrates another stage of the process, in which the individual light emitting dies 113 are singulated along the openings 112. As a result, at least a section of the second bonding portions 122b remain on sidewalls 115 of the individual light emitting dies 113. Techniques for singulating the individual light emitting dies 113 can include dicing, laser ablation, dry etching, and/or other suitable techniques. Subsequently, the process can also include cleaning, packaging, and/or other suitable post-processing operations (not shown).

Figure 1A:
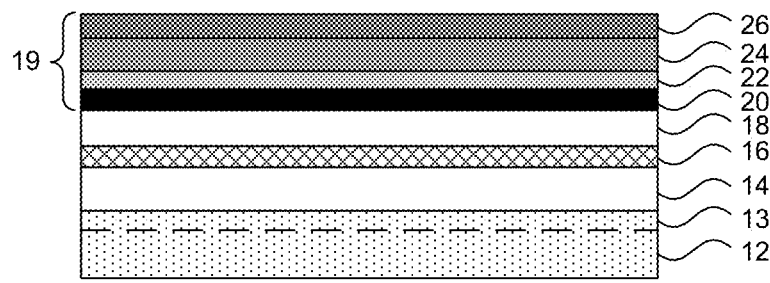
FIGS. 1A-1C illustrate a process for manufacturing an LED with Ni—Sn bonding in accordance with the prior art.
Figure 1B:
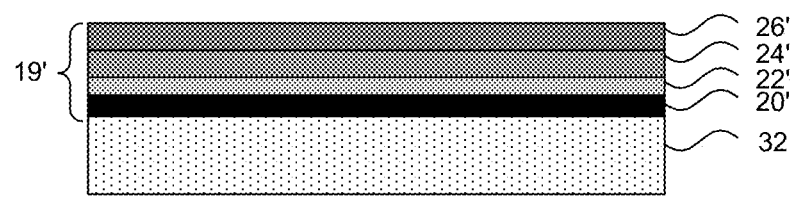
Figure 1C:
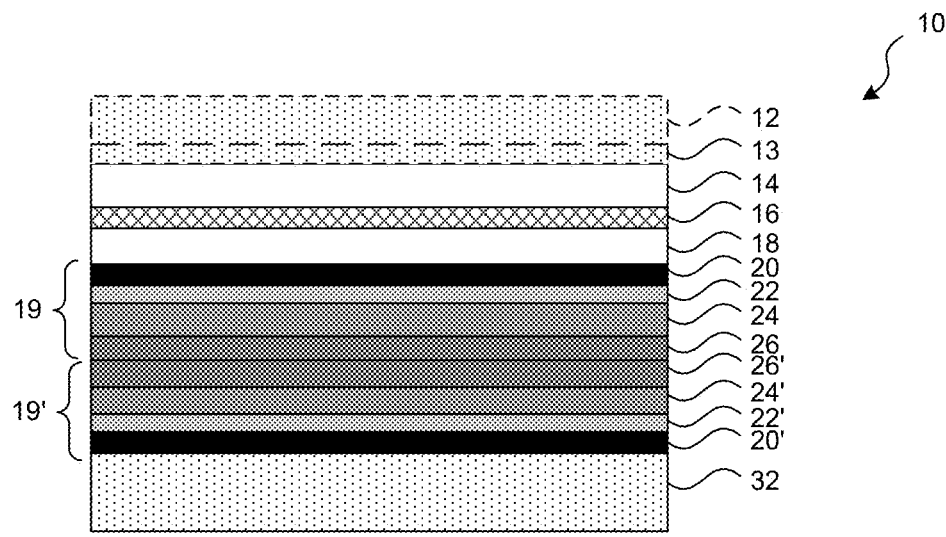

Several embodiments of the process discussed above with reference to FIGS. 2A-2H can bond the light emitting structure 111 to the carrier 132 more efficiently than conventional techniques. As discussed with reference to FIGS. 1A-1C, the conventional Ni—Sn bonding technique requires at least four metal materials to be formed on each of the substrate material 12 (FIG. 1A) and the carrier 32 (FIG. 1B). In contrast, certain embodiments of the current technique include reacting a portion of the bonding material 120 with a silicon material on the carrier 132 and using the remaining portion of the bonding material 120 as a diffusion barrier. As a result, the number of deposition operations can be significantly reduced as compared to the conventional technique, thus reducing manufacturing complexity and costs.

Even though the process discussed above with reference to FIGS. 2A-2H includes forming the plurality of openings 112 prior to forming the bonding stack 122 on the light emitting structure 111, in other embodiments, the sequence of the process may be different and/or include other operations. For example, FIGS. 3A-3F illustrate another embodiment of the process, in which the bonding stack 122 is formed on the light emitting structure 111 without forming the openings 112.

Figure 3A:
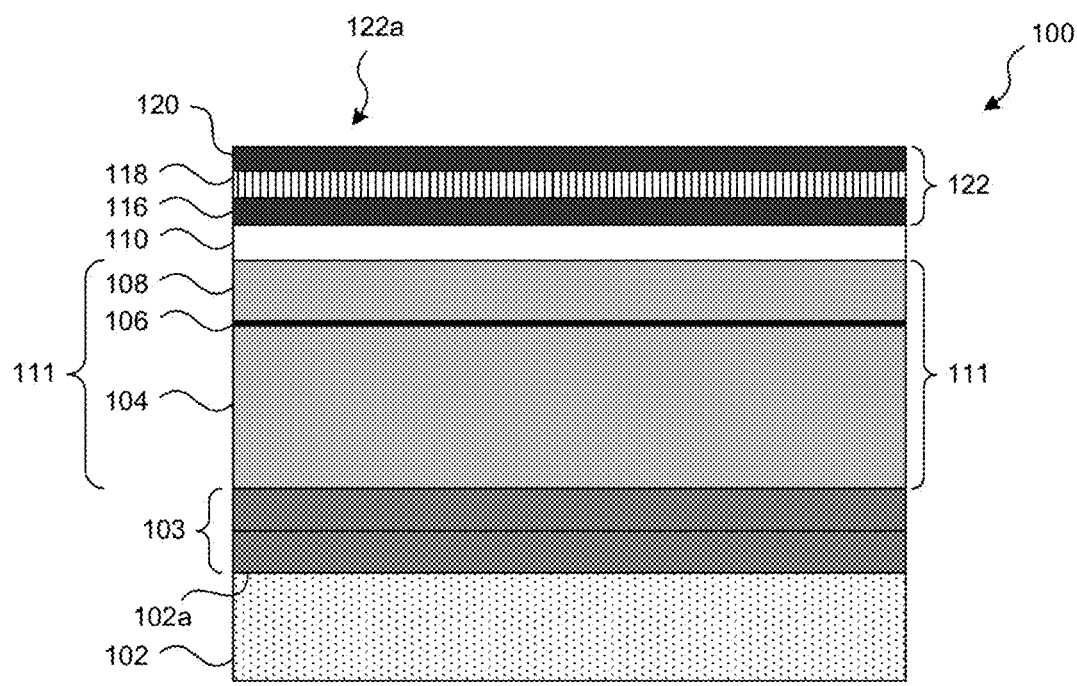
FIGS. 3A-3F illustrate a process for manufacturing an LED with Ni—Si bonding in accordance with additional embodiments of the technology.
Figure 3B:
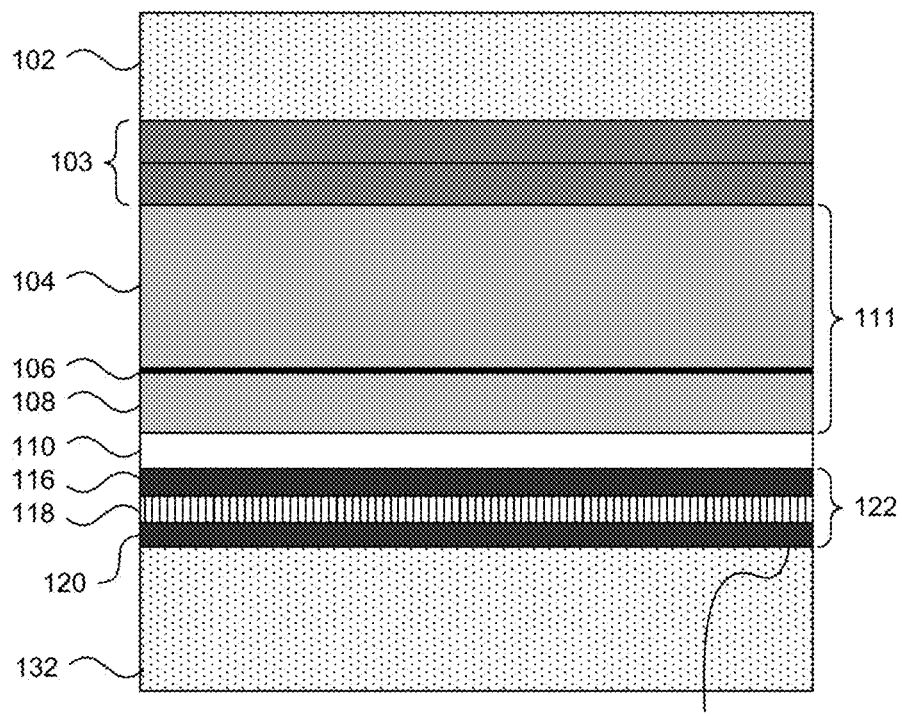
Figure 3C:
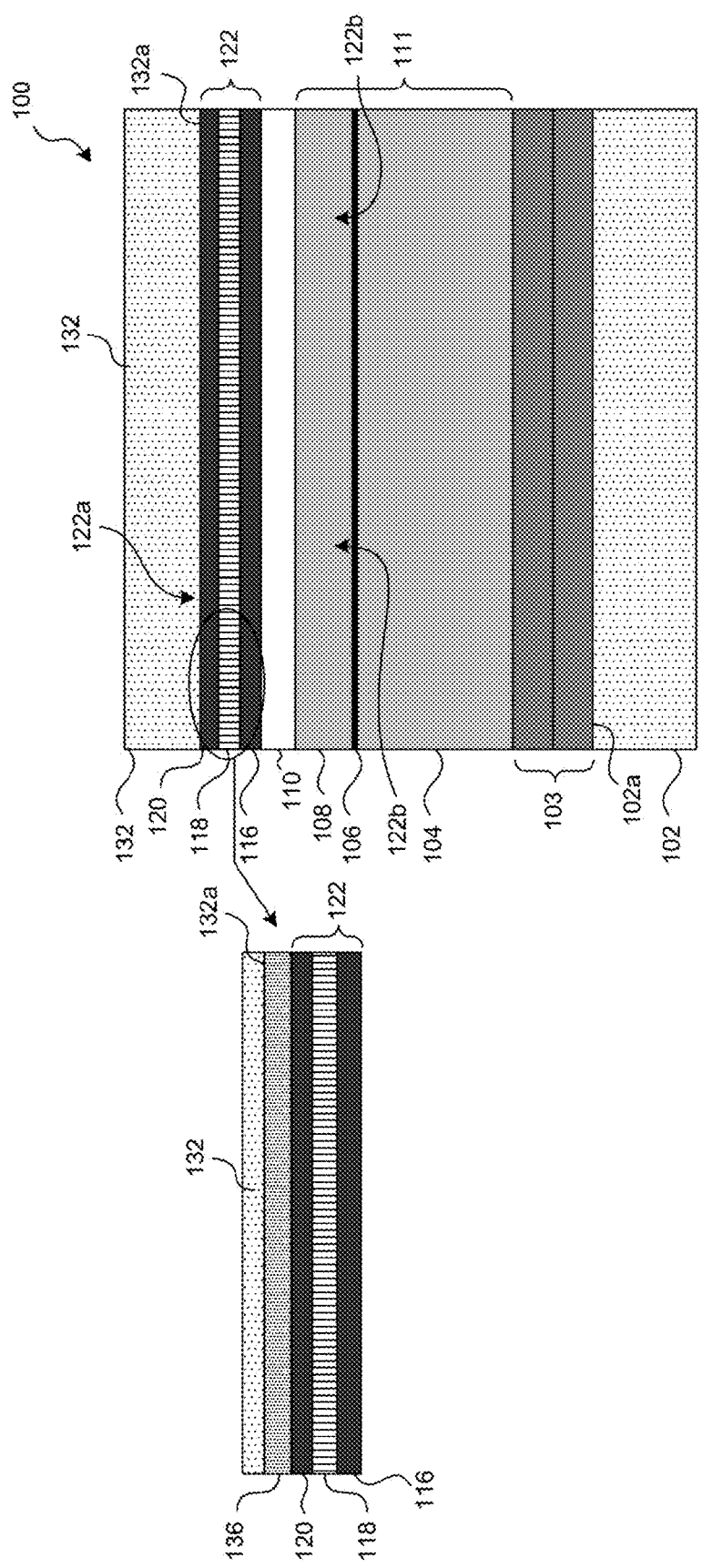
Figure 3D:
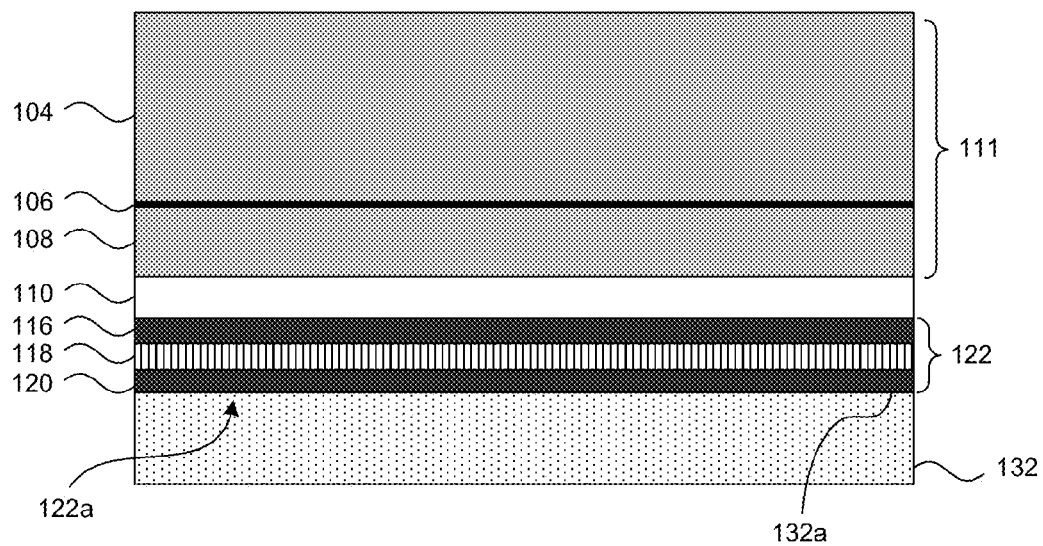
Figure 3E:
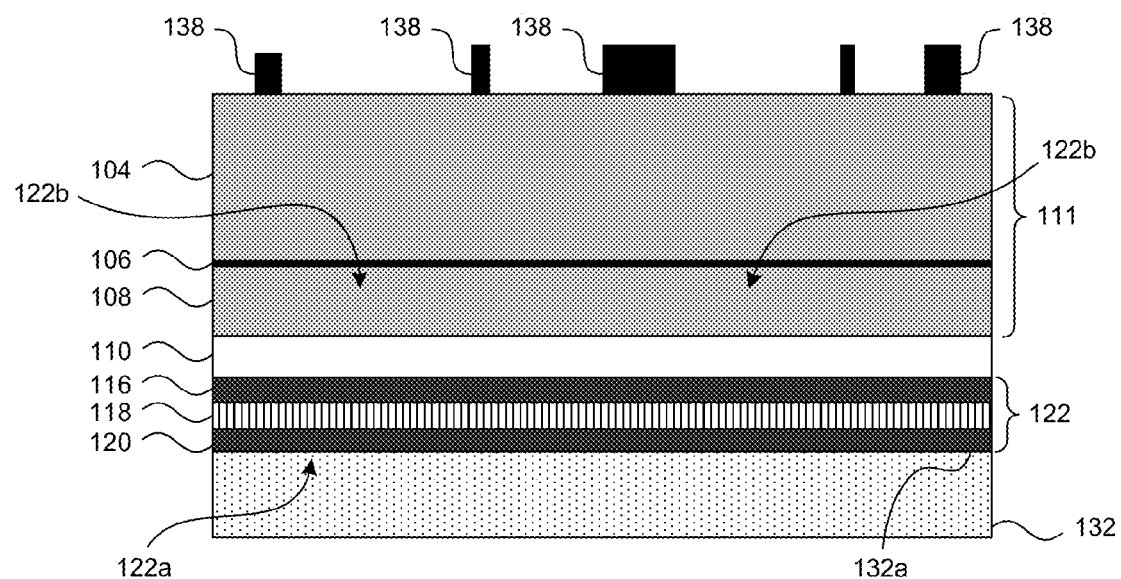
Figure 3F:
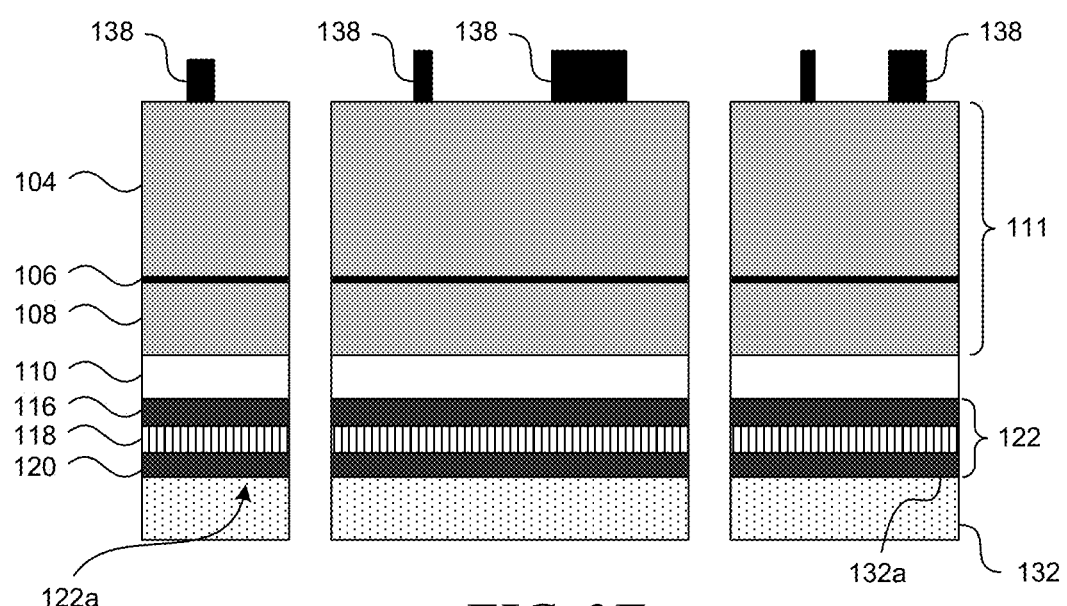

As shown in FIG. 3A, an initial stage of the process can include forming the bonding stack 122 on the optional conductive material 110. Like reference numbers refer to common components in FIGS. 2A-3F. Unlike the embodiments shown in FIG. 2C, the bonding stack 122 in FIG. 3A is generally planar. As shown in FIG. 3B, the light emitting structure 111 is mounted on the carrier 132 with the bonding stack 122 in direct contact with a surface 132a of the carrier 132. Subsequently, as shown in FIG. 3C, the light emitting structure 111 and the carrier 132 are bonded together with techniques generally similar to those discussed above with reference to FIG. 2E. As shown in FIG. 3D, the substrate material 102 and the optional buffer materials 103 have been removed from the light emitting structure 111. As shown in FIG. 3E, first electrodes 138 can then be formed on the exposed first semiconductor material 104. The light emitting structure 111 and the bonded carrier 132 can then be singulated into individual light emitting dies 113, as shown in FIG. 3F.

Several embodiments of the process discussed above with reference to FIGS. 3A-3F may have a higher bonding strength between the bonding material 120 and the carrier 132 than that discussed above with reference to FIGS. 2A-2H because the interface therebetween is generally continuous, as shown in FIGS. 3B and 3C. Also, several embodiments of the process discussed above further simplify the process discussed above with reference to FIGS. 2A-2H by eliminating the formation of the openings 112 and deposition of the passivation material 114 therein. As a result, the complexity and costs related to the process may be further reduced as compared to conventional techniques.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:

1. A lighting emitting die, comprising:
a light emitting structure;
a silicon substrate spaced apart from the light emitting structure; and
a bonding stack between the light emitting structure and the silicon substrate, the bonding stack mechanically coupling the light emitting structure to the silicon substrate, wherein the bonding stack includes
a barrier material on the light emitting structure,
a bonding material spaced apart from the barrier material, the bonding material containing nickel (Ni),
a mirror material directly between the barrier material and the bonding material,
a nickel silicide (NiSi) material at an interface between the silicon substrate and the bonding material,
a first bonding portion on a surface of the light emitting structure, and
a second bonding portion on a sidewall of the light emitting structure.

2. The light emitting die of claim 1 wherein:
the barrier material contains nickel (Ni); and
the mirror material contains silver (Ag).

3. The light emitting die of claim 1 wherein:
the barrier material contains nickel (Ni);
the mirror material contains silver (Ag); and
the bonding stack consists essentially of the barrier material, the bonding material, the mirror material, and the nickel silicide material.

4. The light emitting die of claim 1 wherein:
the light emitting die further includes a conductive material between the light emitting structure and the bonding stack, the conductive material containing at least one of indium tin oxide, aluminum zinc oxide, and fluorine-doped tin oxide;
the silicon substrate includes a P-type silicon substrate;
the barrier material contains nickel (Ni);
the mirror material contains silver (Ag); and
the bonding stack consists essentially of the barrier material, the bonding material, the mirror material, and the nickel silicide material.

5. The light emitting die of claim 1 wherein:
the barrier material contains nickel (Ni);
the mirror material contains silver (Ag); and
the bonding material has a thickness of about 30 Angstroms.

6. The light emitting die of claim 1, further comprising a passivation material on the sidewall of the light emitting structure, the passivation material abutting the second bonding portion.

7. A lighting emitting device, comprising:
a light emitting structure having an opening and a sidewall in the opening;
a silicon substrate spaced apart from the light emitting structure;
a bonding stack between the light emitting structure and the silicon substrate, wherein the bonding stack has a first portion on a surface outside of the opening of the light emitting structure, and a second portion on at least a portion of the sidewall in the opening, and wherein the bonding stack includes—
a barrier material over the light emitting structure,
a bonding material comprising nickel (Ni),
a mirror material spacing the barrier material apart from the bonding material, and
a nickel silicide (NiSi) material at an interface between the silicon substrate and the bonding material.

8. The lighting emitting device of claim 7 wherein the light emitting structure includes a first semiconductor material, a second semiconductor material, and an active region, and wherein the portion of the sidewall extends along at least the first semiconductor material.

9. The lighting emitting device of claim 7, further comprising a substrate material, wherein the light emitting structure is on the substrate material, and wherein the opening extends into the substrate material.

10. The lighting emitting device of claim 7, further comprising a conductive material between the barrier material and the light emitting structure, wherein the opening and the sidewall extend through the conductive material.

11. The lighting emitting device of claim 7, further comprising a passivation material in the opening of the light emitting structure and abutting the second portion of the bonding stack.

12. The light emitting device of claim 7 wherein:
the barrier material contains nickel (Ni); and
the mirror material contains silver (Ag).

13. The lighting emitting device of claim 7, further comprising a conductive material between the light emitting structure and the bonding stack, the conductive material containing at least one of indium tin oxide, aluminum zinc oxide, and fluorine-doped tin oxide.

14. The lighting emitting device of claim 7 wherein the silicon substrate includes a P-type silicon substrate.

15. A lighting emitting die, comprising:
a light emitting structure having an opening and a sidewall in the opening;
a conductive material on a portion of the light emitting structure that is outside of the opening;

a silicon substrate spaced apart from the light emitting structure; and a bonding stack between the light emitting structure and the silicon substrate, the bonding stack mechanically coupling the light emitting structure to the silicon substrate, wherein the bonding stack includes—
 a barrier material on the light emitting structure,
 a bonding material spaced apart from the barrier material, the bonding material containing nickel (Ni),
 a mirror material directly between the barrier material and the bonding material,
 a nickel silicide (NiSi) material at an interface between the silicon substrate and the bonding material,
 a first bonding portion on the conductive material, and
 a second bonding portion on the sidewall of the light emitting structure.

16. The light emitting die of claim 15 wherein:
the barrier material contains nickel (Ni);
the mirror material contains silver (Ag); and
the bonding stack consists essentially of the barrier material, the bonding material, the mirror material, and the nickel silicide material.

17. The light emitting die of claim 15, further comprising a passivation material on the sidewall of the light emitting structure, the passivation material abutting the second bonding portion.

18. The lighting emitting die of claim 17, further comprising a substrate material, wherein:
 the light emitting structure is on the substrate material;
 the opening extends at least to the substrate material; and
 a portion of the passivation material abuts the substrate material.

19. The lighting emitting die of claim 18, further comprising a buffer material between the substrate material and the light emitting structure.

20. The light emitting die of claim 15 wherein the conductive material contains at least one of indium tin oxide, aluminum zinc oxide, and fluorine-doped tin oxide.

* * * * *